US006961457B2

(12) United States Patent
Sugawara

(10) Patent No.: US 6,961,457 B2
(45) Date of Patent: Nov. 1, 2005

(54) BONDING APPARATUS AND BONDING METHOD

(75) Inventor: Kenji Sugawara, Kokubunji (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 508 days.

(21) Appl. No.: 09/964,210

(22) Filed: Sep. 25, 2001

(65) Prior Publication Data

US 2002/0039437 A1 Apr. 4, 2002

(30) Foreign Application Priority Data

Sep. 25, 2000 (JP) ....................................... 2000-290071

(51) Int. Cl.[7] ................................................. G06K 9/00
(52) U.S. Cl. ........................ 382/151; 382/144; 382/145
(58) Field of Search ......................... 382/141, 143–152; 348/86, 87, 125, 126; 356/237.1, 237.4, 237.5

(56) References Cited

U.S. PATENT DOCUMENTS 4,962,423 A * 10/1990 Yamada et al. ............. 382/144
5,050,111 A * 9/1991 Ayata et al. ................ 700/302

FOREIGN PATENT DOCUMENTS

JP S63-236340 10/1988
JP H2000-100858 4/2000

* cited by examiner

*Primary Examiner*—Vikkram Bali
(74) *Attorney, Agent, or Firm*—Koda & Androlia

(57) ABSTRACT

In an apparatus and method for obtaining offset amount between a reference pattern on, for instance, a semiconductor device and a bonding tool in order to specify bonding points on the semiconductor device, a reduction process is performed on the high-magnification image acquired by a first camera, and this processed image is compared with a low-magnification image acquired by a second camera, thus obtaining an amount of deviation between an image center mark that constitutes the reference point of the high-magnification image and an image center mark that constitutes the reference point of the low-magnification image. Then, the offset amount between the second camera and the bonding tool is calculated by adding the calculated amount of deviation to the offset amount between the first camera and the bonding tool.

4 Claims, 6 Drawing Sheets

BONDING APPARATUS AND BONDING METHOD

BACKGROUND OF THE INVENTION

1. Field of the Invention

The present invention relates to a bonding apparatus and method and more particularly to an apparatus and method that allows accurate calculation of the amount of deviation in imaging devices that takes images of elements to be bonded.

2. Prior Art

In an existing wire bonding apparatus, a position detection camera (called a "camera") and a bonding arm are disposed on a bonding head. The camera is mounted on an XY table; and in order to specify the bonding points on bonding parts such as semiconductor devices and the like upon which bonding is performed, the camera takes an image of a reference pattern of the bonding parts. The bonding arm is provided with a tool that is attached to one end of the arm and performs bonding.

The camera and the tool are provided on the bonding head with the optical axis of the camera and the axial center of the tool being shifted by a fixed distance in the X and Y directions so that the tool and bonding arm do not interfere with the visual field of the camera when the camera takes images of the specific pattern of a bonding member.

Generally, the distance between the optical axis of the camera and the axial center of the tool is referred to as a "camera-tool offset amount" or simply an "offset amount".

Since the camera determines a reference point that is used to ascertain the position to which the tool is moved, it is extremely important to ascertain exactly how far the camera is offset from the tool. However, the actual offset amount varies from instant to instant as a result of, for instance, thermal expansion of a camera holder and bonding arm caused by radiant heat from the high-temperature bonding stage. Accordingly, the offset amount must be measured and calibrated when the bonding operation is initiated, and such must be also measured and calibrated with an appropriate timing during the bonding operation.

Various methods have been proposed for the measurement and calibration of offset amounts, and Japanese Patent Application Laid-Open (Kokai) No. 2000-100858 discloses one example.

In this prior art, the tip end of a tool is brought into contact with an appropriate location of a semiconductor device or in the vicinity of a semiconductor device, and a pressure mark is formed. Next, an XY table is driven so that the bonding head is moved by an offset amount that is stored beforehand in a memory, and an image including the pressure mark is acquired by the camera. Furthermore, the positional coordinates of the center point of the pressure mark are determined by performing image processing on the image thus obtained. Then, the offset amount is measured by calculating the distance between the positional coordinates of the center point of the pressure mark and the positional coordinates of the optical axis for the X and Y directions and by adding the offset amount stored beforehand in memory to this calculated distance.

Meanwhile, in the recent method, a plurality of cameras are employed and mounted on an XY table. In such method, a camera having a higher magnification is used for positioning and recognition on, for instance, the pad side, and another camera having a lower magnification is used for positioning and recognition on, for instance, the lead side. Japanese Patent Application Laid-Open (Kokai) No. S63-236340, for instance, discloses this method. In this prior art method, high-precision bonding on the pads is performed using the camera with the higher magnification, and the images of numerous leads are processed at one time using the camera with a lower magnification. Accordingly, an efficient performance is expected.

Consequently, it is possible to use the above-described conventional offset amount measurement method in an apparatus that uses a plurality of cameras; and in such a case, the offset amounts between the individual cameras and the tool are measured separately. However, the tool becomes worn or deformed as a result of use; and it is necessary to replace the tool at a frequency of approximately once a day. Therefore, the offset amounts between the individual cameras and the tool must be measured every time the tool is replaced. Such an operation is, however, practically very difficult to execute.

SUMMARY OF THE INVENTION

Accordingly, the object of the present invention is to simplify the measurement of offset amounts when a plurality of cameras are used in a bonding apparatus.

The above object is accomplished by a unique structure for a bonding apparatus that comprises a processing member (tool) which processes bonding parts upon which bonding is to be performed, a first imaging device (camera) which images a specific pattern of the bonding parts, and a first offset calculating means which calculates the amount of offset between the processing member and the first imaging device based upon the image data acquired by the first imaging device; and the unique structure of the present invention is that the bonding apparatus further comprises:

- a second imaging device (camera) which images the specific pattern of the bonding parts, and
- a second offset calculating means which calculates the amount of deviation between the reference point of the first image data acquired by the first imaging device and the reference point of the second image data acquired by the second imaging device, the calculation being performed based upon the first image data and the second image data.

In this structure, the amount of deviation between the reference point of the first image data acquired by the first imaging device, which is a camera, and a reference point of the second image data acquired by the second imaging device, which is also a camera, is calculated based upon the first image data and second image data. Accordingly, the offset amount between the second imaging device and the tool is calculated on the basis of the offset amount between the first imaging device and the tool by way of using the calculated offset amount. As a result, the need for re-measurement of the offset amount between the second imaging device and the tool can be eliminated even when the tool is replaced.

In the above structure, the second offset calculating means calculates the amount of deviation between the reference point of the first image data and the reference point of the second image data based upon the first magnification, which is an imaging magnification of the first imaging device, and a second magnification, which is an imaging magnification of the second imaging device.

Accordingly, the amount of deviation between the reference point of the first image and the reference point of the second image is calculated based upon the first magnification, which is the imaging magnification of the first imaging device, and a second magnification, which is the imaging magnification of the second imaging device. Accordingly, an accurate amount of deviation, that takes the magnifications of the individual imaging devices into account, can be calculated.

Furthermore, in the present invention, when calculating the amount of deviation that takes the magnifications of the individual imaging devices into account, the image data on the lower magnification side is used "as is"; and this is done by performing a reduction processing so that the image data with a higher magnification among the first image data obtained by the first imaging device and the second image data obtained by the second imaging device is caused to match the imaging magnification on the lower magnification side, and an image obtained by this reduction processing is compared with the image data on the lower magnification side.

Furthermore, the above-described object is accomplished by a unique method of the present invention that is used in a bonding apparatus which is comprised of: a processing member (tool) that processes bonding parts upon which bonding is to be performed, a first imaging device (camera) that images a specific pattern, a second imaging device (camera) that images the specific pattern, and a first offset calculating means that calculates an amount of offset between said processing member and the first imaging device based upon image data acquired by the first imaging device, wherein the amount of deviation between a reference point of the first image data acquired by the first imaging device and a reference point of the second image data acquired by the second imaging device is calculated, and such a calculation is executed based upon the first image data and the second image data.

In the above method, the amount of deviation between the reference point of the first image data and the reference point of the second image data is calculated on the basis of a first magnification, which is the imaging magnification of the first imaging device, and a second magnification, which is the imaging magnification of the second imaging device.

Furthermore, in the above method of the present invention a reduction processing is performed in which the image data with a higher magnification among the image data obtained by the first imaging device and the image data obtained by the second imaging device is caused to match the imaging magnification on the lower magnification side, and an image that is obtained by the reduction processing is compared with the image data on the lower magnification side.

DETAILED DESCRIPTION OF THE INVENTION

Figure 1:
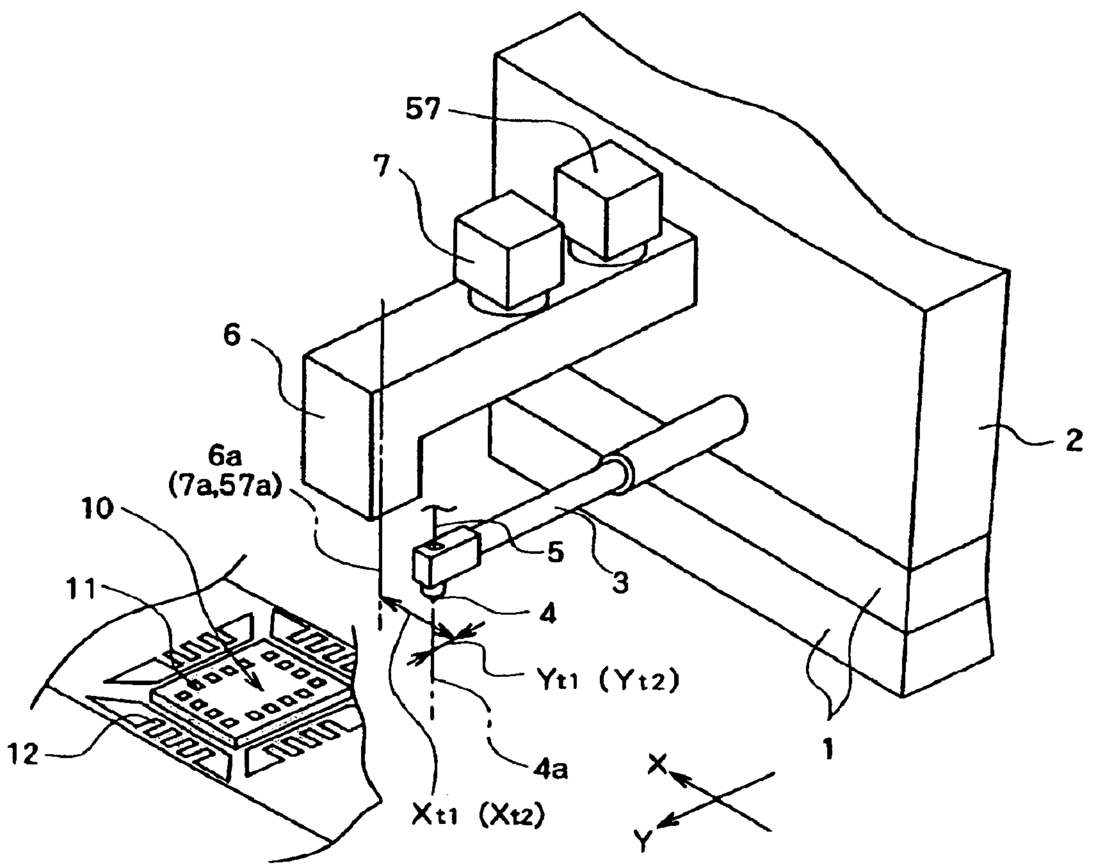
FIG. 1 is a perspective view of the essential portion of a bonding apparatus according to one embodiment of the present invention.

Embodiments of the present invention will be described below with reference to the accompanying drawings.

As seen from FIGS. 1 through 5 that illustrate one embodiment of the present invention, a bonding arm 3 is installed so as to be movable up and down on a bonding head 2 that is mounted on an XY table 1. The bonding arm 3 is driven upward and downward by a vertical driving means (not shown). A tool 4 is attached to the tip end portion of the bonding arm 3, and a wire 5 is passed through the tool 4. The tool 4 in the shown embodiment is a capillary.

A mirror tube 6 is provided on the bonding head 2, and a first camera 7 and second camera 57 are respectively installed in the mirror tube 6. The first camera 7 and second camera 57 are both photoelectric transducer-type imaging devices which are equipped with a charge-coupled device (CCD) and a lens system. The first camera 7 images the pads 11 of the semiconductor device 10 at a high magnification. The second camera 57 images the leads 12 at a low magnification. The imaging axis 6*a* of the mirror tube 6 and the axial center 4*a* of the tool 4 are both oriented vertically downward. The XY table 1 is accurately moved in the X and Y directions by means of two pulse motors (not shown) which are disposed near the XY table. The structure described thus far is known in the prior art.

Figure 2:
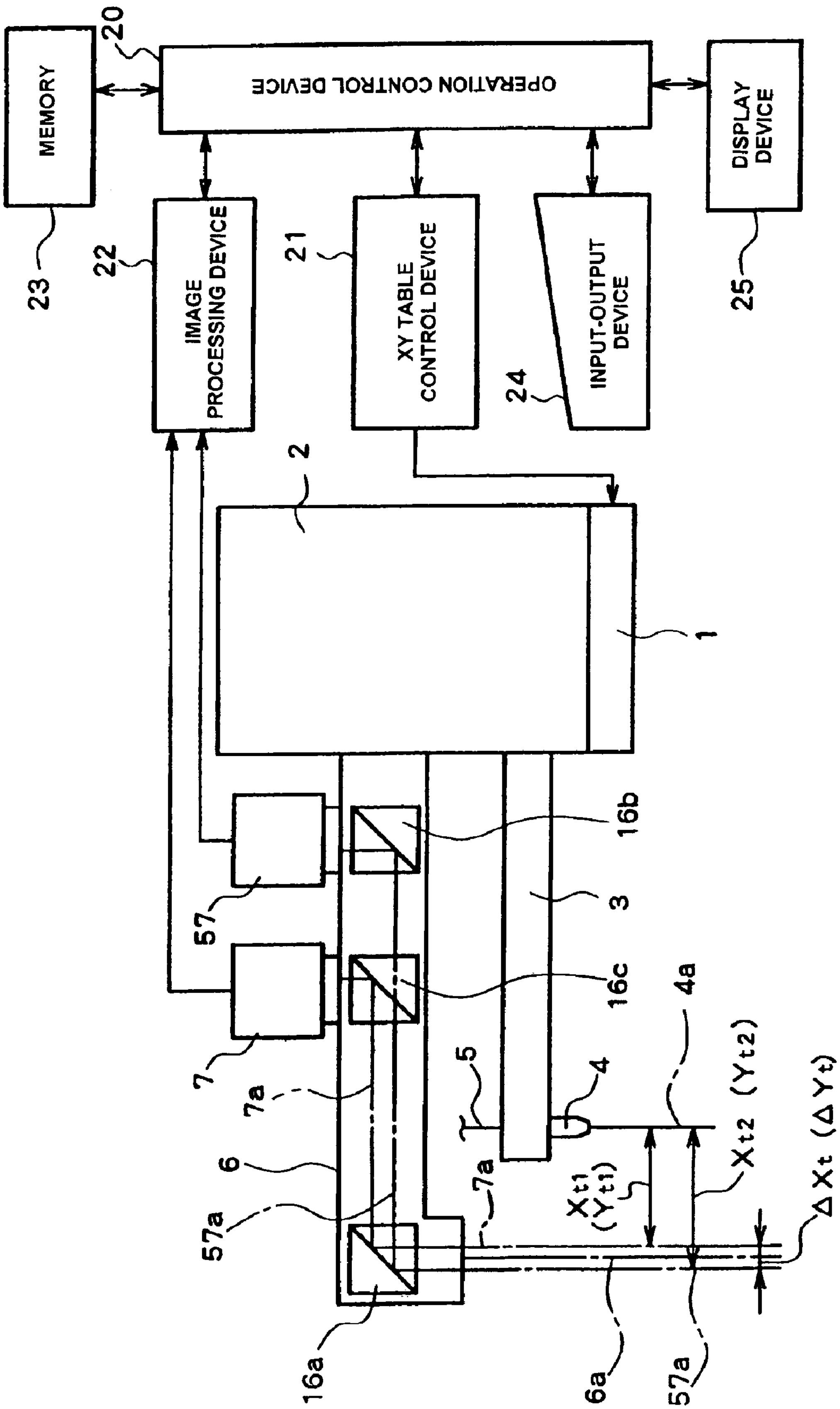
FIG. 2 is a block diagram showing the optical system and control system of the embodiment of FIG. 1.

In FIG. 2, the mirror tube 6 is a tubular body and is equipped with mirrors 16*a* and 16*b* and a half-mirror 16*c*. The mirror 16*a* has a reflective surface that reflects in the rightward direction light that is incident vertically upward from below in FIG. 2. The half-mirror 16*c* causes reflected light from the mirror 16*a* to branch into reflected light that is directed upward and transmitted light that is directed to the right. The mirror 16*b* reflects the transmitted light from the half-mirror 16*c* upward.

Figure 3:
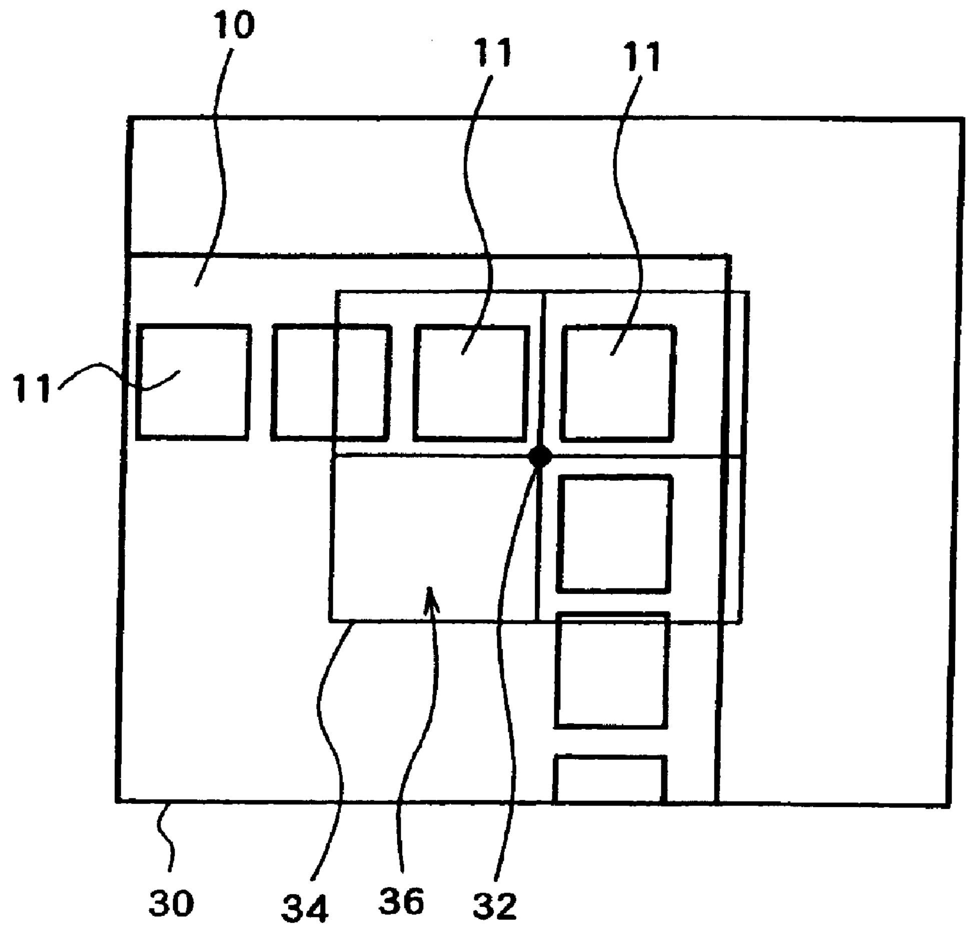
FIG. 3 is an explanatory diagram that shows the high-magnification image.
Figure 4:
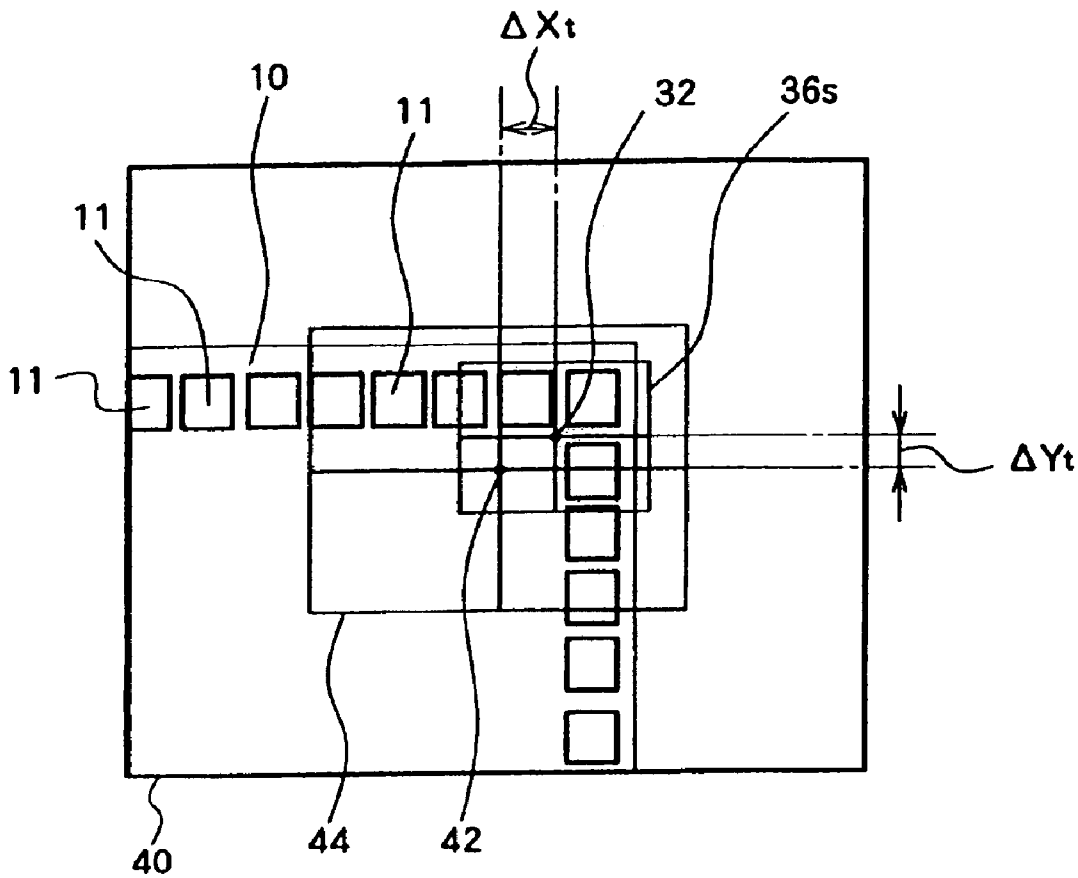
FIG. 4 is an explanatory diagram that shows the low-magnification image.

FIG. 3 shows a high-magnification image 30 acquired by the first camera 7, and FIG. 4 shows a low-magnification image 40 acquired by the second camera 57. The high-magnification image 30 and low-magnification image 40 respectively have image center marks 32 and 42 and reticle marks 34 and 44. The image center marks 32 and 42 are displayed and stored in a memory as marks that indicate the center of the visual field in respective images. The reticle marks 34 and 44 are displayed and stored in the memory as marks that indicate a region inside the visual field surrounding the image center marks 32 and 42.

The light paths 7*a* and 57*a* corresponding to the image center marks 32 and 42 (see FIG. 2) and the axial center 4*a* of the tool 4 are offset from each other in the X and Y directions. The offset amounts between the light path 7*a* and the axial center 4*a* are ($Xt1$, $Yt1$), and the offset amounts between the light path 57*a* and the axial center 4*a* are ($Xt2$, $Yt2$). The offset amounts between the light path 7*a* and the light path 57*a* are ($\Delta Xt$, $\Delta Yt$).

The light paths 7*a* and 57*a* need not necessarily coincide with the optical axes of the first camera 7 and second camera 57. Also, they do not need to coincide with the imaging axis 6*a* of the mirror tube 6, either.

The XY table 1 is driven via an XY table control device 21 by commands from an operation control device 20. The image data acquired by the imaging of the first camera 7 and second camera 57 is converted into electrical signals and processed by an image processing device 22, and the accurate offset amounts ($Xt1$, $Yt1$), ($\Delta Xt$, $\Delta Yt$) and ($Xt2$, $Yt2$) are calculated by the operation control device (which is a computer) using a method that will be described below. An input-output device 24 and a display device 25 are connected to the operation control device 20. The display device 25 is, for instance a CRT; and the low-magnification image 30, high-magnification image 40 and other images acquired by the first camera 7 and second camera 57 are displayed on the display device 25.

Next, the operation of the present embodiment will be described.

Figure 6:
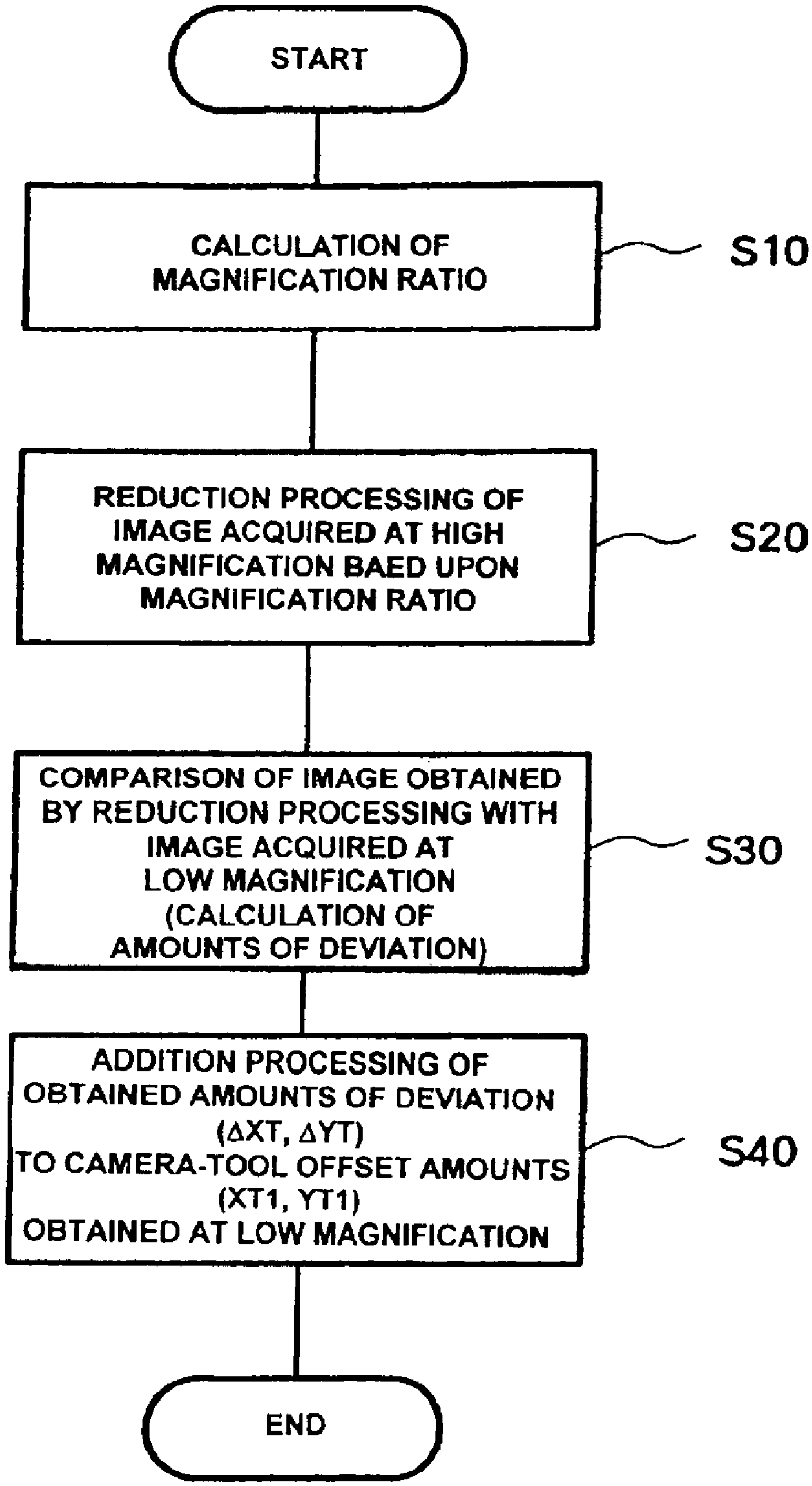
FIG. 6 is a flow chart that shows an example of the control process of the present invention.

First, in FIG. 6, the magnification ratio of the first camera 7 and second camera 57 is calculated (S10). The calculation of this magnification ratio is accomplished by determining the magnifications on the high-magnification side and the low-magnification side and then by dividing the magnification on the low-magnification side by the magnification on the high-magnification side.

First, in regards to the high-magnification side, the XY table 1 is moved a specified distance (e.g., 200 μm) by a command from the operation control device 20 while imaging is performed by the first camera 7. Next, the number of movement pixels on the screen generated in the high-magnification image 30 before and after this movement is counted or measured. Then, the magnification ml on the high-magnification side is calculated by dividing the number of movement pixels (e.g., 80 pixels) by the movement distance of the XY table 1.

Furthermore, in regards to the low-magnification side, the XY table 1 is moved a specified distance (e.g., 870 μm) by a command from the operation control device 20 while imaging is performed by the second camera 57. Next, the number of movement pixels on the screen generated in the low-magnification image 40 before and after this movement is counted or measured. Then, the magnification ms on the low-magnification side is calculated by dividing the number of movement pixels (e.g., 80 pixels) by the movement distance of the XY table 1. Since the object of the calculation of these magnifications ml and ms is to detect the rotational components of the first camera 7 and second camera 57 as well, such calculations are respectively performed for both the X direction and Y direction. Moreover, since the counting or measurement of the number of movement pixels is performed so as to detect the rotational components of the cameras as well, the counting or measurement may be performed in respective steps during the movement.

Then, the magnification ratio mp is calculated by dividing the calculated magnification ms on the low-magnification side by the magnification ml on the high-magnification side.

Next, of the image data acquired by the first camera 7, a reduction processing is performed on the image data in the region 36 inside the reticle mark 34 (S20); as a result, a reduced image 36*s* is obtained for the image data in the region 36. More specifically, the image data in the region 36 is converted into a reduced image 36*s* by multiplying the image data in the region 36 by the magnification ratio mp.

Next, the reduced image 36*s* and the low-magnification image 40 acquired at the low magnification are compared, and the amount of deviation is calculated (S30). More specifically, an image pattern that has a high correlation within the low-magnification image 40 is first detected by means of a gray scale normalized correlation, etc., using the reduced image 36*s* as a template image, so that the position of the image corresponding to the reduced image 36*s* within the low-magnification image 40 is recognized.

Next, the reduced image 36*s* which is accompanied by the image center mark 32 and reticle marks 34 and 44 is superimposed on the low-magnification image 40 (see FIG. 4).

Then, the amounts of deviation (ΔXt, ΔYt) between the image center mark 32 of the superimposed reduced image 36*s* and the image center mark 42 of the low-magnification image 40 are calculated by the image processing device 22.

Finally, the offset amounts (Xt2, Yt2) between the light path 57*a* and the axial center 4*a* are determined according to the Numerical Expression 1 by adding the calculated amounts of deviation (ΔXt, ΔYt) to the offset amounts (Xt1, Yt1) between the light path 7*a* and axial center 4*a* that have been determined beforehand and stored in the memory 23 (S40), and this routine is ended.

Numerical Expression 1

$$Xt2=Xt1+\Delta Xt$$

$$Yt2=Yt1+\Delta Yt$$

The offset amounts (Xt2, Yt2) between the optical path 57*a* and the axial center 4*a* that are on the low-magnification side and have thus been obtained are utilized in subsequent wire bonding that is performed on the leads 12. More specifically, a specified reference point on the semiconductor device 10 is imaged by the second camera 57, and the XY table 1 is driven so that the bonding head 2 is moved by the determined offset amounts (Xt2, Yt2); then, bonding is performed by the tool 4 to the respective bonding points on the leads stored as XY coordinates in the memory 23.

On the other hand, the offset amounts (Xt1, Yt1) between the light path 7*a* and the axial center 4*a* that are on the high-magnification side are calculated by the conventional method. In other words, the offset amounts (Xw1, Yw1) between the first camera 7 and the tool 4 are stored beforehand in the memory 23. When the differences between the accurate offset amounts (Xt1, Yt1) and the offset amounts (Xw1, Yw1) stored beforehand in the memory 23, i.e., the offset correction amounts, are designated as (ΔX1, ΔY1), these accurate offset amounts (Xt1, Yt1), the pre-stored offset amounts (Xw1, Yw1) and the offset correction amounts (ΔX1, ΔY1) are related as shown by Numerical Expression 2.

Numerical Expression 2

$$Xt1=Xw1+\Delta X1$$

$$Yt1=Yw1+\Delta Y1$$

Figure 5:
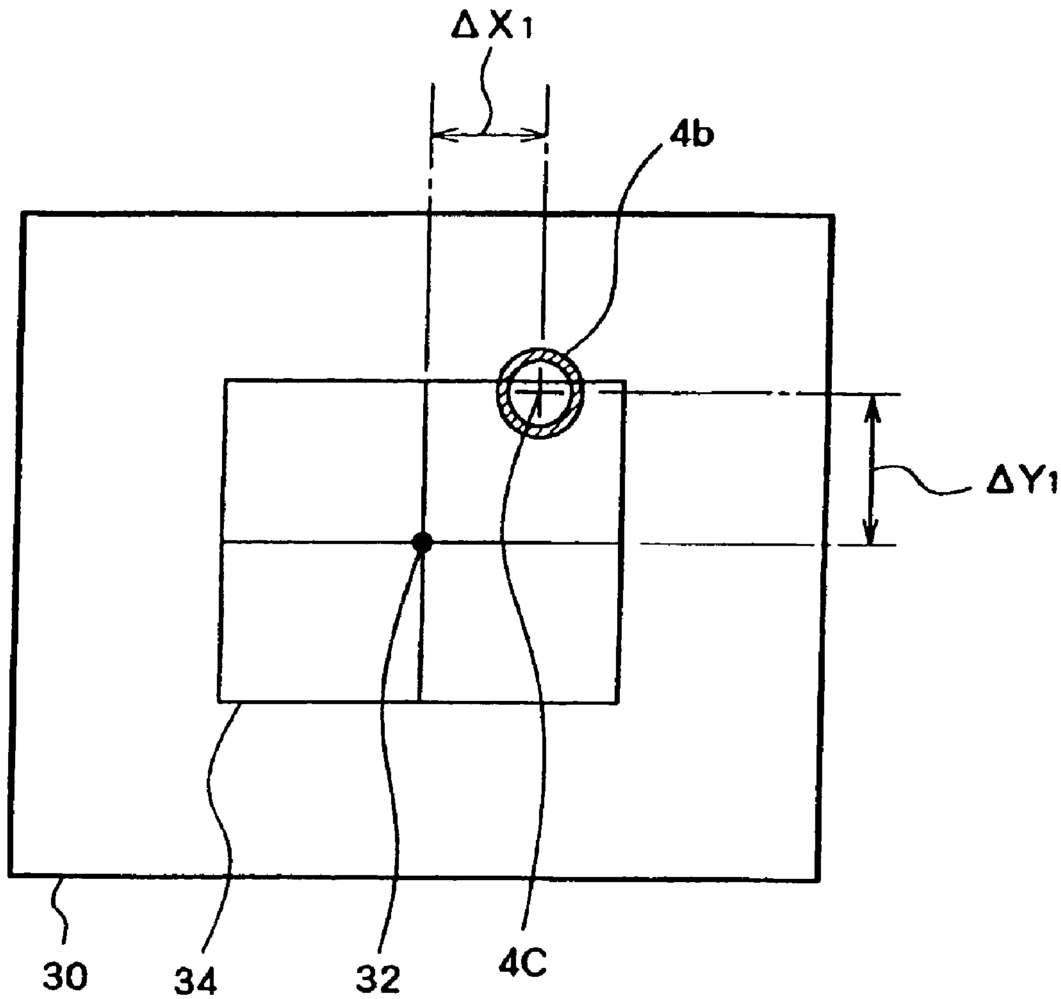
FIG. 5 is an explanatory diagram that shows the process of measurement of the offset amounts between the first camera and the tool.

First, as shown in FIG. 5, the tip end of the tool 4 is brought to contact the semiconductor device 10 or an appropriate location in the vicinity of the semiconductor device 10, and a pressure mark 4*b* is formed. Next, the XY table 1 is driven by a command from the operational processing device 20 via the XY table control device 21 so that the bonding head 2 is moved by the pre-stored offset amounts (Xw1, Yw1), and an image is acquired by the first camera 7. Then, image processing is performed on the high-magnification image 30 thus obtained, so that the distance between the pressure mark center point 4*c* (which is the center point of the image of the pressure mark 4*b*) and the image center mark 32 is calculated as the offset correction amounts (ΔXt, ΔYt). The offset amounts (Xt1, Yt1) between the light path 7*a* (which is the high-magnification side) and the axial center 4*a* thus obtained are used in the calculation of the offset amounts (Xt2, Yt2) between the light path 57*a* (which is the low-magnification side) and the axial center 4*a* in step S40 as described above.

As seen from the above, in the shown embodiment, the amounts of deviation between the image center mark 32 which is the reference point of the high-magnification image 30 and the image center mark 42 which is the reference point of the low-magnification image 40 are calculated on the basis of the high-magnification image 30 acquired by the first camera 7 and the low-magnification image 40 acquired by the second camera 57. Accordingly, by way of using these calculated amounts of deviation, the offset amounts between the second camera 57 and the tool 4 are calculated on the basis of the offset amounts between the first camera 7 and the tool 4. As a result, the need to re-measure the offset amounts between the second camera 57 and tool 4 when the tool 4 is replaced, etc., can be eliminated.

In the meantime, it is sufficient to perform the calculation of the amounts of deviation in the routine shown in FIG. 6 only in limited cases such as at the time of initial setting when the apparatus is assembled and at the time when the first camera 7 and/or second camera 57 is replaced.

Further, the amounts of deviation between the image center mark 32 of the high-magnification image and the image center mark 42 of the low-magnification image are calculated on the basis of the magnification ml, which is the imaging magnification of the first camera 7, and the magnification ms, which is the imaging magnification of the second camera 57. Accordingly, accurate amounts of deviation that take the magnification of the individual cameras 7 and 57 into account can be obtained.

Also, in order to calculate the amounts of deviation with the magnifications of the individual cameras 7 and 57 taken into account, the image data with a higher magnification among the data of the high-magnification image acquired by the first camera 7 and the low-magnification image acquired by the second camera 57 is subjected to reduction processing so that this data is caused to match the imaging data on the low-magnification side, and this processed data is compared with the image data on the low-magnification side. Accordingly, the image data that is on the low-magnification side can be utilized "as is" in the calculation of the amounts of deviation.

In the above embodiment, a portion of the semiconductor device 10 is utilized as a reference pattern to compare the high-magnification image 30 and low-magnification image 40. However, some other member instead of the semiconductor device 10, e.g., a portion of the lead frame that holds the leads 12 or a portion of the bonding table, can be used as the reference pattern.

Furthermore, the image center marks 32 and 42 are utilized as reference points to make a comparison between the high-magnification image 30 and the low-magnification image 40. However, it is not absolutely necessary that such reference points be located in the centers of the high-magnification image 30 and low-magnification image 40. Any points inside the high-magnification image 30 and low-magnification image 40 can be used. When the image center marks 32 and 42 which are located in the centers of the high-magnification image 30 and low-magnification image 40 are used as in the shown embodiment, the central regions of the images that contains a little distortion can be used, and accurate measurement is accomplished.

In the shown embodiment, the image center marks 32 and 42 that are respectively a single point in each image, i.e., one point in the high-magnification image 30 and one point in the low-magnification image 40, are used as reference points. However, in the present invention, a plurality of points can be used as the reference points; and in cases where a plurality of reference points are used, the amount of deviation between the first camera 7 and second camera 57 in the direction of their rotations can also be easily measured and ascertained.

Furthermore, the image center marks 32 and 42 and reticle marks 34 and 44 are displayed on the display device 25. This construction is advantageous in that the image center marks 32 and 42 and reticle marks 34 and 44 can easily be matched with portions that readily form a reference pattern within the visual fields of the respective cameras. However, the center marks 32 and 42 and reticle marks 34 and 44 need not be displayed on the display device 25.

In addition, a common mirror tube 6 is used for the first camera 7 and second camera 57. However, the present invention is applicable to a bonding apparatus in which a plurality of cameras are separately installed in a plurality of camera holders mounted on the bonding head 2. In such a case, however, in order to compare the image data acquired by the plurality of cameras in the present invention, the plurality of cameras must image a common pattern or must at least respectively image a plurality of patterns that are accurately positioned with respect to each other.

Furthermore, in the above, the tool 4 is a capillary. However, the processing member used in the present invention may be any member that performs some type of processing in connection with the object of processing, e.g., some other tool such as a wedge, etc., or a probe used for inspection, etc.

Furthermore, two imaging devices are used in the shown embodiment. However, three or more imaging devices can be used in the present invention. Further, in the above embodiment, the processing member is a single tool 4. However, the present invention can also be used for the measurement of offset amounts between a plurality of processing members and a plurality of imaging devices.

Though cameras are used as imaging devices in the above embodiment, it is sufficient that the imaging device is capable of detecting light. Thus, for example, line sensors may also be used.

Moreover, the above embodiments are described with reference to a wire bonding apparatus. However, it should be easily understood by one of skilled in the art that the present invention is applicable to various other types of bonding apparatuses such as die bonding apparatuses, tape bonding apparatuses and flip-chip bonding apparatuses.

What is claimed is:

1. A bonding apparatus comprised of a processing member that processing bonding parts, a first imaging device of high magnification that images a specific pattern, and a first offset calculating means that calculates an amount of offset between said processing member and said first imaging device based upon image data acquired by said first imaging device, said bonding apparatus further comprising:

a second imaging device that images said specific pattern, said second imaging device having low magnification that is lower than said first imaging device, and a second offset calculating means that calculates an amount of deviation between a reference point of a first image data acquired by said first imaging device and a reference point of second image data acquired by said second imaging device based upon said first image data and said second image data and wherein said second offset calculating means calculates said offset by:

performing reduction processing so that the image data with higher magnification obtained by said first imaging device and image data obtained by said second imaging device are caused to match an imaging magnification on a lower magnification side, and comparing an image obtained by said reduction processing with said image data on said lower magnification aside.

2. The bonding apparatus according to claim 1, wherein said second offset calculating means calculates said amount of deviation between said reference point of said first image data and said reference point of said second image data based upon:

a first magnification which is an imaging magnification of said first imaging device, and a second magnification which is an imaging magnification of said second imaging device.

3. A bonding method used in a bonding apparatus which is comprised of processing member that processes bonding parts, a high magnification first imaging device that images a specific pattern, a low magnification second imaging device that images said specific pattern and a first offset calculating means that calculates an amount of offset between said processing member and said first imaging device based upon image data acquired by said first imaging device, wherein:

said method calculates an amount of deviation between a reference point on a first image data acquired by said first imaging device and a reference point of a second image data acquired by said second imaging device, said calculating being performed based upon said first image data and said second image data, said calculating an amount of deviation by the steps of:

performing a reduction processing so that image data with a higher magnification obtained by said first imaging device and image data obtained by said second image device are caused to match an imaging magnification on a lower magnification side, and comparing data subjected to said reduction processing with said image data on said lower magnification side.

4. The bonding method according to claim 3, wherein said amount of deviation between said reference point of said first image data and said reference point of said second image data is calculated based upon a first magnification which is an imaging magnification of said first imaging device and a second magnification which is an imaging magnification of said second imaging device.

* * * * *